(12) United States Patent
Chang et al.

(10) Patent No.: US 12,432,953 B2
(45) Date of Patent: Sep. 30, 2025

(54) FinFET STRUCTURES AND METHODS OF FORMING THE SAME

(71) Applicant: Taiwan Semiconductor Manufacturing Co., Ltd., Hsinchu (TW)

(72) Inventors: Shih-Chieh Chang, Taipei (TW); Shahaji B. More, Hsinchu (TW); Cheng-Han Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 165 days.

(21) Appl. No.: 17/815,443

(22) Filed: Jul. 27, 2022

(65) Prior Publication Data

US 2022/0359730 A1    Nov. 10, 2022

Related U.S. Application Data

(63) Continuation of application No. 15/705,063, filed on Sep. 14, 2017, now Pat. No. 11,476,349.

(Continued)

(51) Int. Cl.
*H10D 30/01*    (2025.01)
*H10D 30/62*    (2025.01)
(Continued)

(52) U.S. Cl.
CPC .......... *H10D 30/024* (2025.01); *H10D 30/62* (2025.01); *H10D 30/6212* (2025.01);
(Continued)

(58) Field of Classification Search
CPC ..... H01L 21/823418; H01L 21/823814; H01L 21/823425; H01L 29/0847; H01L 29/7848;
(Continued)

(56) References Cited

U.S. PATENT DOCUMENTS 8,772,109 B2 * 7/2014 Colinge ............ H01L 21/30625
438/269
8,785,285 B2    7/2014 Tsai et al.
(Continued)

FOREIGN PATENT DOCUMENTS

KR    20160119889 A    10/2016

*Primary Examiner* — Wael M Fahmy
*Assistant Examiner* — Quinton A Brasfield
(74) *Attorney, Agent, or Firm* — Slater Matsil, LLP

(57) ABSTRACT

A method includes forming a first fin and a second fin over a substrate, depositing an isolation material surrounding the first and second fins, forming a gate structure along sidewalls and over upper surfaces of the first and second fins, recessing the first and second fins outside of the gate structure to form a first recess in the first fin and a second recess in the second fin, epitaxially growing a first source/drain material protruding from the first and second recesses, and epitaxially growing a second source/drain material on the first source/drain material, wherein the second source/drain material grows at a slower rate on outermost surfaces of opposite ends of the first source/drain material than on surfaces of the first source/drain material between the opposite ends of the first source/drain material, and wherein the second source/drain material has a higher doping concentration than the first source/drain material.

20 Claims, 17 Drawing Sheets

Related U.S. Application Data

(60) Provisional application No. 62/434,965, filed on Dec. 15, 2016.

(51) Int. Cl.
  *H10D 62/00* (2025.01)
  *H10D 62/13* (2025.01)
  *H10D 62/40* (2025.01)
  *H10D 62/82* (2025.01)
  *H10D 62/822* (2025.01)

(52) U.S. Cl.
  CPC ......... *H10D 62/021* (2025.01); *H10D 62/151* (2025.01); *H10D 62/405* (2025.01); *H10D 62/82* (2025.01); *H10D 62/822* (2025.01)

(58) Field of Classification Search
  CPC ......... H01L 29/66636; H01L 29/41783; H01L 29/66575; H01L 29/161; H01L 29/167; H01L 29/41725; H01L 29/41733; H01L 29/41791; H01L 29/4175; H01L 29/41766; H01L 29/41775; H01L 21/823475; H01L 21/823871; H01L 21/76895; H01L 21/76897; H01L 21/743; H01L 21/76804; H01L 21/76805; H01L 23/5226; H01L 23/5283; H01L 23/5286; H01L 23/528; H01L 23/481; H01L 23/535; H01L 23/5384; H01L 23/5386; H01L 21/823431; H01L 21/823821; H01L 21/845; H01L 27/0886; H01L 27/0924; H01L 27/1211; H01L 27/10826; H01L 27/10879; H01L 29/66795–66818; H01L 29/785–7856; H01L 2029/7857–7858; H01L 2924/13067; H01L 21/76889; H01L 21/28518; H10D 84/0158; H10D 84/0193; H10D 84/834; H10D 84/853; H10D 86/011; H10D 86/215; H10D 30/024; H10D 30/0241; H10D 30/0243; H10D 30/0245; H10D 30/62; H10D 30/6211; H10D 30/6212; H10D 30/6213; H10D 30/6215; H10D 30/6217; H10D 30/6218; H10D 30/6219; H10D 84/013–0133; H10D 84/017; H10D 84/0128; H10D 84/0167; H10D 62/021; H10D 62/149–161; H10D 62/299; H10D 62/307; H10D 30/0277; H10D 30/0218; H10D 30/022; H10D 30/601–608; H10D 30/6715–6721; H10D 30/0223–0229; H10D 30/0215; H10D 30/0221; H10D 64/251–259; H10D 64/647–649; H10D 62/405; H10D 30/6717; H10D 30/603; H10B 12/36; H10B 12/056

See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,159,833 B2 | 10/2015 | Ching et al. | |
| 9,236,267 B2 | 1/2016 | De et al. | |
| 9,236,300 B2 | 1/2016 | Liaw | |
| 9,263,339 B2 | 2/2016 | Cheng et al. | |
| 9,437,496 B1* | 9/2016 | Chudzik | H10D 30/024 |
| 9,520,482 B1 | 12/2016 | Chang et al. | |
| 9,576,814 B2 | 2/2017 | Wu et al. | |
| 9,831,116 B2 | 11/2017 | Lee et al. | |
| 9,870,926 B1* | 1/2018 | Huang | H01L 21/76805 |
| 10,297,601 B2* | 5/2019 | Kim | H10B 10/12 |
| 11,476,349 B2* | 10/2022 | Chang | H10D 30/62 |
| 2011/0210404 A1* | 9/2011 | Su | H10D 84/0193 438/296 |
| 2013/0187206 A1* | 7/2013 | Mor | H10D 30/024 257/288 |
| 2013/0270652 A1 | 10/2013 | Liaw | |
| 2015/0035023 A1* | 2/2015 | Kim | H10D 84/038 257/288 |
| 2015/0060945 A1 | 3/2015 | Murthy et al. | |
| 2015/0069526 A1* | 3/2015 | Basker | H10D 30/024 438/283 |
| 2016/0276345 A1 | 9/2016 | Yu et al. | |
| 2016/0293717 A1* | 10/2016 | Kim | H10D 62/151 |
| 2017/0352726 A1 | 12/2017 | Zhou et al. | |

* cited by examiner

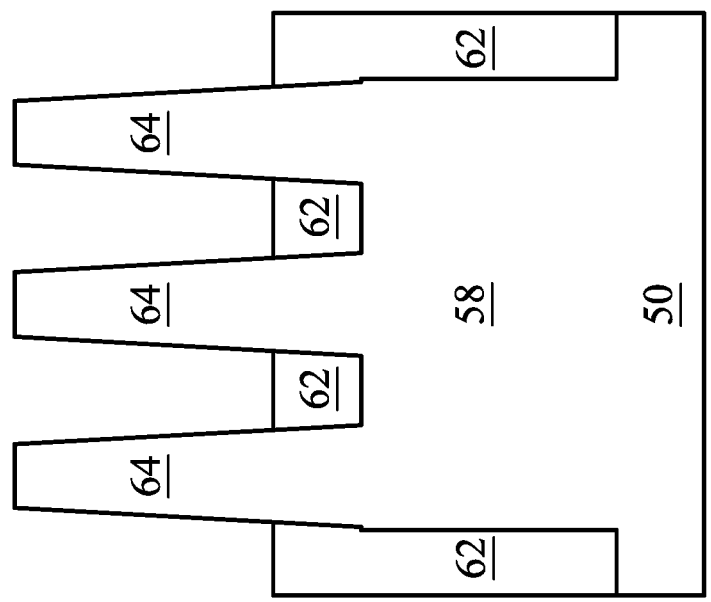

FinFET STRUCTURES AND METHODS OF FORMING THE SAME

PRIORITY CLAIM AND CROSS-REFERENCE

This application is a continuation of U.S. patent application Ser. No. 15/705,063, filed Sep. 14, 2017 and entitled "FinFET Structures and Methods of Forming the Same," which claims the benefit of the following provisionally filed U.S. patent application: Application No. 62/434,965, filed Dec. 15, 2016, and entitled "FinFET Structures and Methods of Forming the Same," which applications are hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 6A-6B, 7A-7B, and 8 through 15 are cross-sectional views of intermediate stages in the manufacturing of FinFETs in accordance with some embodiments.

DETAILED DESCRIPTION

Figure 1:
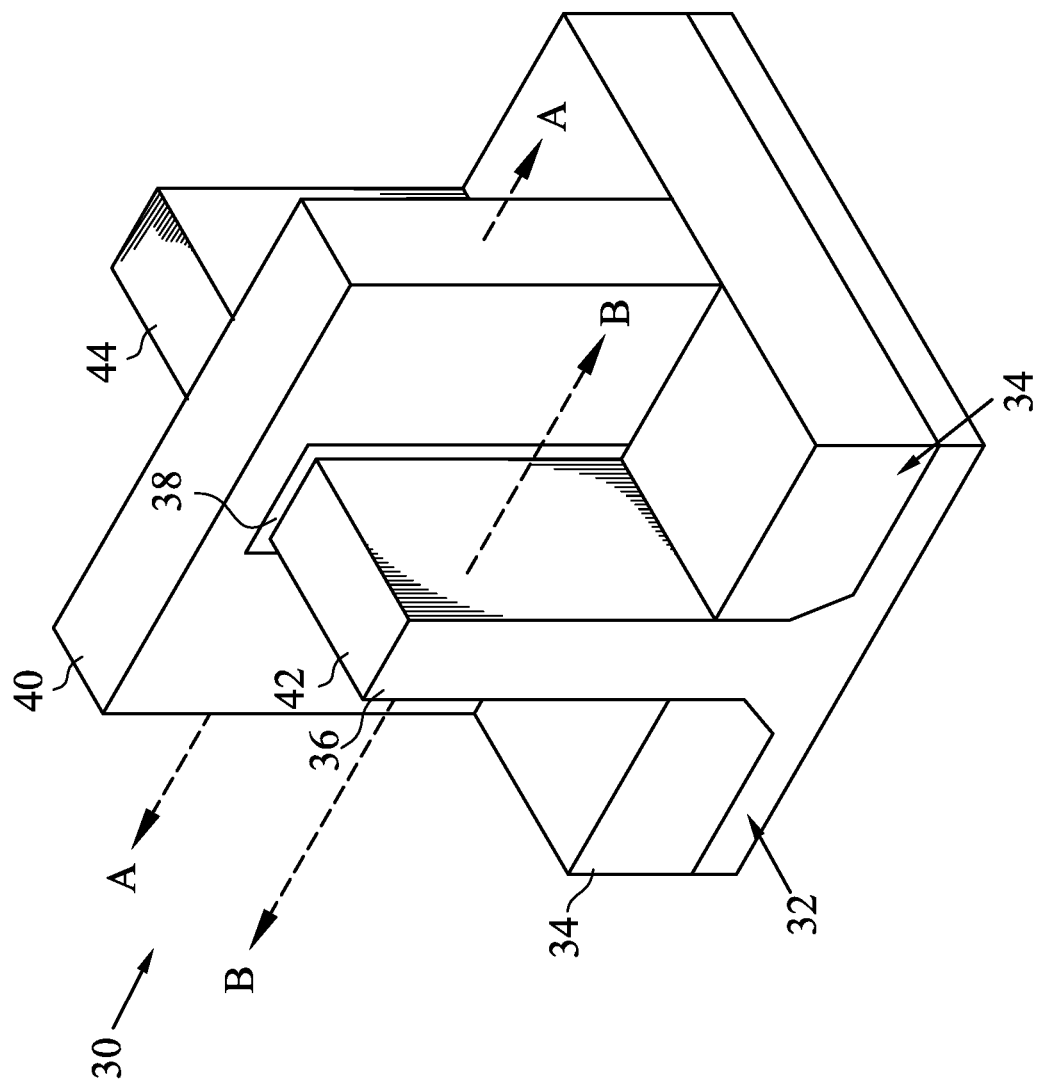
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-first process. In other embodiments, a gate-last process (sometimes referred to as replacement gate process) may be u sed. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple process flow to achieve a flat-topped epitaxial source/drain in a FinFET, for device enhancement. In addition, this flat-topped epitaxial source/drain increases the contact landing area which can reduce the contact resistance to the source/drain region. The epitaxial source/drain may also include a higher-doped portion that can also reduce contact resistance and facilitate merging of the epitaxial source/drain grown on adjacent fins.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the FinFET 30. Cross-section B-B is parallel to cross-section A-A and is across a source/drain region 42. Subsequent figures refer to these reference cross-sections for clarity.

Figure 6A:
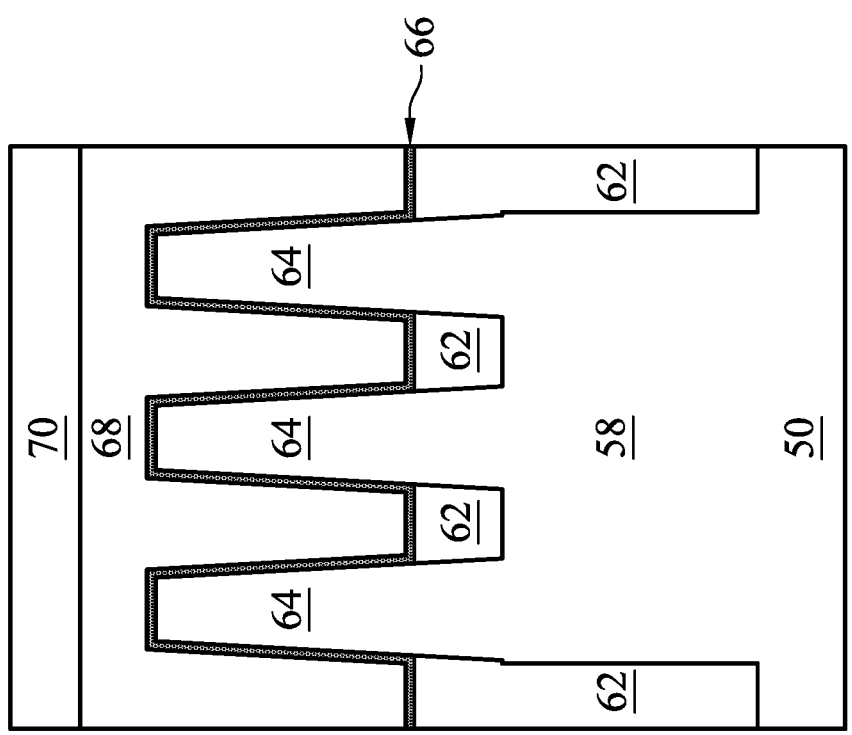
Figure 7A:
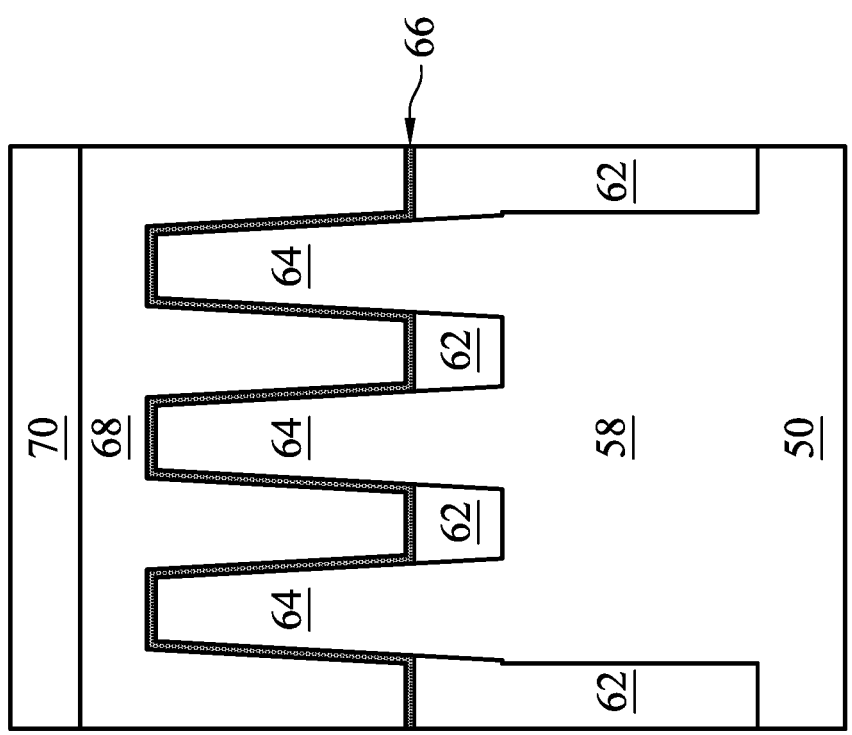
Figure 7B:
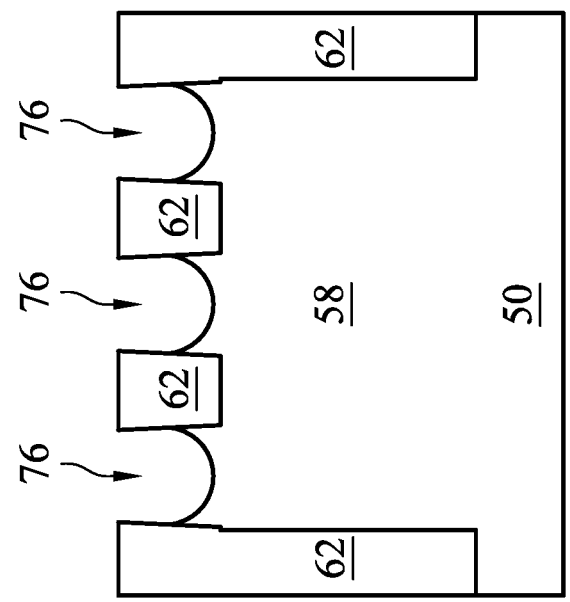

FIGS. 2 through 15 are cross-sectional views of intermediate stages in the manufacturing of FinFETs in accordance with some embodiments. FIGS. 2 through 15 illustrate a FinFET similar to FinFET 30 in FIG. 1, except for multiple fins on a crown structure. FIGS. 2-5 illustrate both cross-section A-A and cross-section B-B. FIGS. 6A and 7A illustrate cross-section A-A, and FIGS. 6B and 7B illustrate cross-section B-B. FIGS. 8 through 15 illustrate cross-section B-B.

Figure 2:
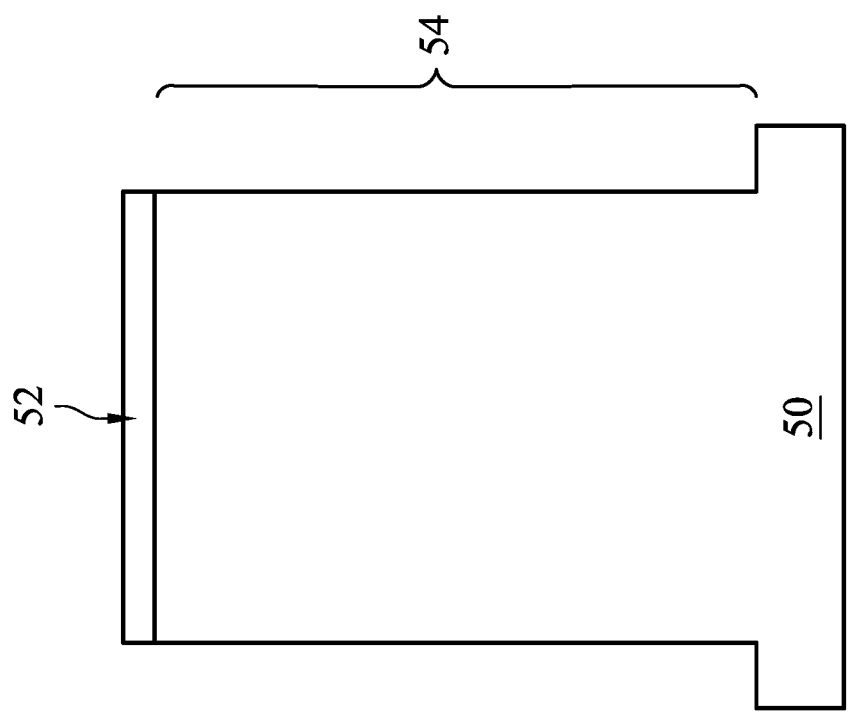

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

FIG. 2 further illustrates the formation of a mask layer 52 over the substrate and the patterning of the substrate 50 using the mask layer 52 to form a patterned portion 54 of the substrate 50. In some embodiments, the mask layer 52 is a hard mask and may be referred to as hard mask 52 hereinafter. The hard mask 52 may be formed of silicon nitride, silicon oxynitride, silicon carbide, silicon carbonitride, the like, or a combination thereof.

In some embodiments, the patterned portion 54 of the substrate 50 may be formed by etching the substrate 50 that lies outside of the patterned mask layer 52. The etching may be any acceptable etch process, such as a reactive ion etch (RIE), neutral beam etch (NBE), the like, or a combination thereof. The etch may be anisotropic.

Figure 3:
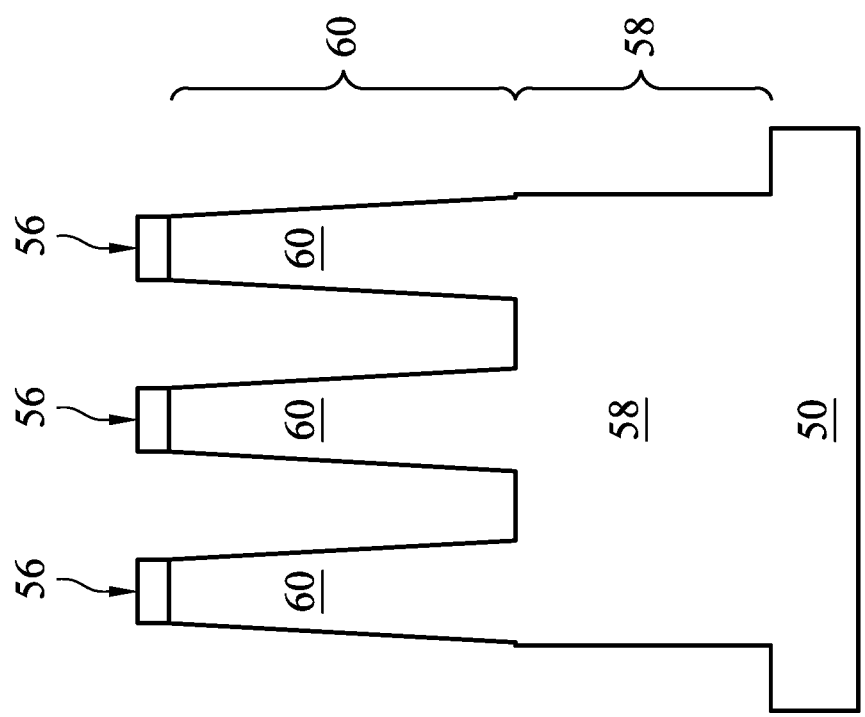

FIG. 3 illustrates the formation of a crown structure 58 and semiconductor strips 60 over the crown structure 58. A mask layer 56 may be formed and patterned over the patterned portion 54 of the substrate 50. In some embodiments, the mask layer 56 is a hard mask and may be referred to as hard mask 56 hereinafter. The hard mask 56 may be formed of silicon nitride, silicon oxynitride, silicon carbide, silicon carbonitride, the like, or a combination thereof.

In some embodiments, the crown structure 58 and the semiconductor strips 60 may be formed by etching trenches in the hard mask 56 and the patterned portion 54 of the substrate 50. The semiconductor strips 60 may also be referred to as semiconductor fins 60. The etching may be any acceptable etch process, such as a RIE, NBE, the like, or a combination thereof. The etch may be anisotropic.

Figure 4:
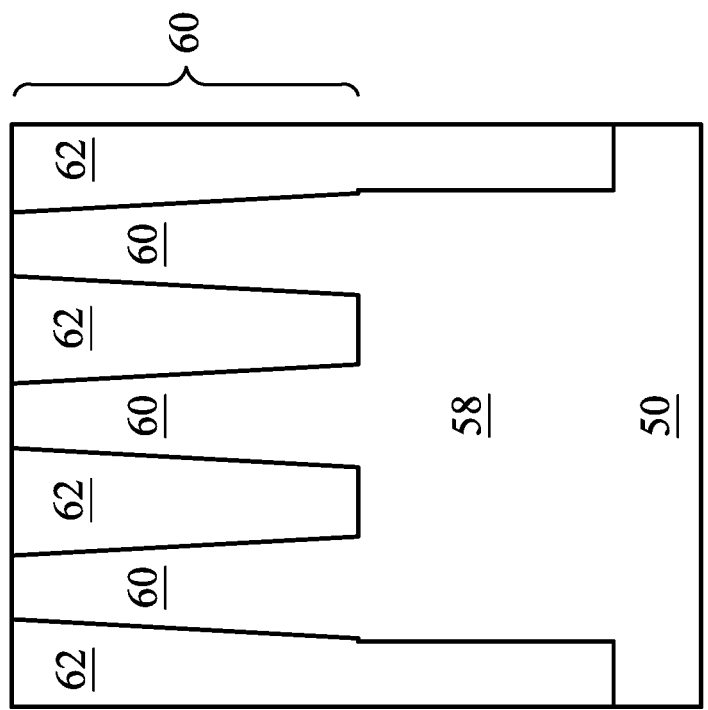

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4, a planarization process, such as a chemical mechanical polish (CMP), may remove any excess insulation material (and, if present, the hard mask 56) and form top surfaces of the isolation regions 62 and top surfaces of the semiconductor strips 60 that are coplanar.

Figure 5:
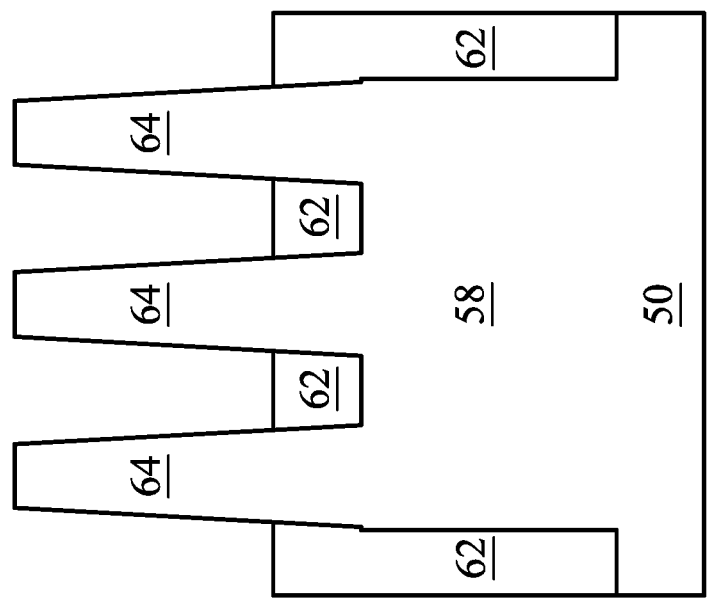

FIG. 5 illustrates the recessing of the isolation regions 62, such as to form shallow trench isolation (STI) regions. The isolation regions 62 are recessed such that the upper portions of the semiconductor strips 60 protrude from between neighboring isolation regions 62 and form semiconductor fins 64. As illustrated, some portions of the isolation regions 62 remains on top of the crown structure 58 between the adjacent semiconductor fins 64. Further, the top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 6A and 6B illustrate the formation of a gate structure over a portion of the semiconductor fins 64. FIG. 6A illustrates cross-section A-A, and FIG. 6B illustrates cross-section B-B as shown in FIG. 1. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66. The gate 68 and gate dielectric 66 cover respective channel regions of the semiconductor fins 64. The gate 68 may also have a lengthwise direction substantially perpendicular to the lengthwise direction of respective semiconductor fins 64.

FIGS. 7A and 7B illustrate the removal the semiconductor fins 64 outside of the gate structure. FIG. 7A illustrates cross-section A-A, and FIG. 7B illustrates cross-section B-B as shown in FIG. 1. The gate structure may be used as a mask during the removal of the semiconductor fins 64 and such that recesses 76 are formed in in the semiconductor fins 64 and/or isolation regions 62. As illustrated, after the removal of the semiconductor fins 64, at least a portion of the isolation regions 62 remains on the top surface of the crown structure 58 between the adjacent semiconductor fins 64.

The recesses 76 may be formed by etching using any acceptable etch process, such as a RIE, NBE, tetramethylammonium hydroxide (TMAH), ammonium hydroxide ($N_{H_4}OH$), a wet etchant capable of etching silicon with good etch selectivity between silicon and a material of the isolation regions 62 and/or the gate seal spacer material 72, the like, or a combination thereof. The etch may be anisotropic. In some embodiments, the top surface of the crown structure 58 is exposed as at least portions of the bottom surfaces of the recesses 76.

Figure 8:
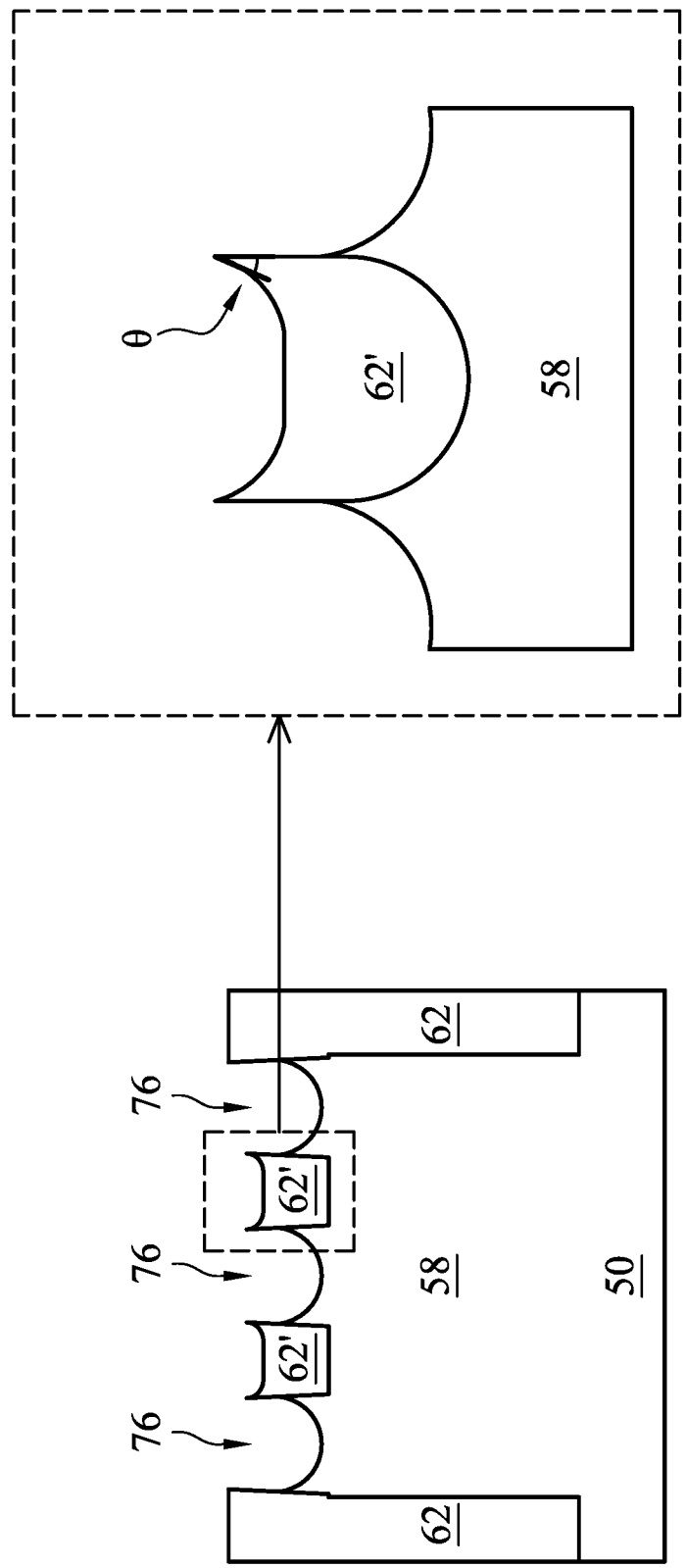

FIG. 8 illustrates the further recessing of the isolation regions 62 located between the recesses 76 (as shown previously in FIG. 7B) to form recessed isolation regions 62'. (FIGS. 8 through 15 illustrate cross-section B-B as shown in FIG. 1 and FIG. 7B.) The isolation regions 62 are recessed such that the top surfaces of the recessed isolation regions 62' may be formed concave by an appropriate etch, as shown in FIG. 8. In some embodiments, the isolation regions 62 are etched such that the recessed isolation regions 62' extend a particular height above the top surface of the crown structure 58, or are etched to have a particular thickness. The height or thickness of the recessed isolation regions 62' may be controlled, for example, by controlling the duration of the etch process. In some embodiments, the isolation regions 62 are etched such that the recessed isolation regions 62' have a particular sidewall angle θ between the edge of the concave surface and the sidewall. An example sidewall angle θ is indicated in an inset illustration shown in FIG. 8. For example, the isolation regions 62 may be etched such that the recessed isolation regions 62' have a certain sidewall angle θ between about 40° and about 80°, such as an angle θ of about 50°. The sidewall angle θ may be controlled, for example, by controlling the selectivity of the etch process. In some cases, the height, thickness, and/or the sidewall angle of the recessed isolation regions 62' may be selected to improve uniformity of the top surface of the source/drain regions (described below). The isolation regions 62 may be recessed using an acceptable etching process, such as one that is selective to the material of the isolation regions 62. The etching process may be a dry etching process or a wet etching process.

Figure 9:
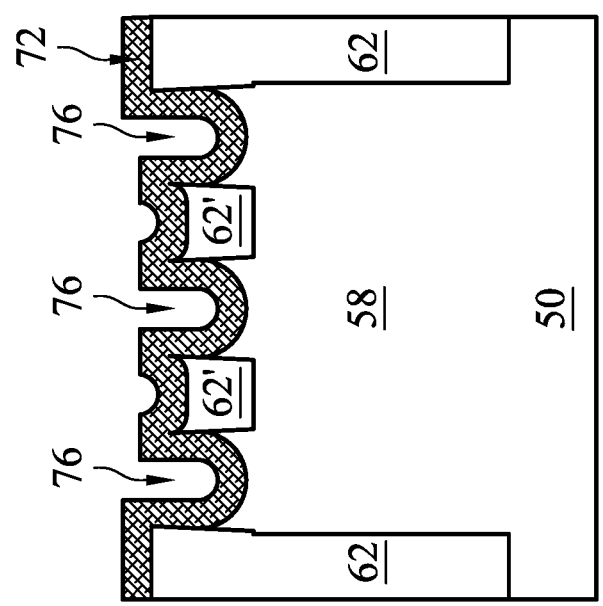

FIG. 9 illustrates the formation of gate seal spacer material 72 on exposed surfaces of isolation regions 62 and crown structure 58. The gate seal spacer material 72 may also be formed on the semiconductor fins 64, gate 68, and mask 70 to form gate seal spacers (not shown). A thermal oxidation or a deposition process may form the gate seal spacer material 72. In some embodiments, the gate seal spacer material 72 may be formed of a nitride, such as silicon nitride, silicon oxynitride, silicon carbide, silicon carbonitride, the like, or a combination thereof.

Figure 10:
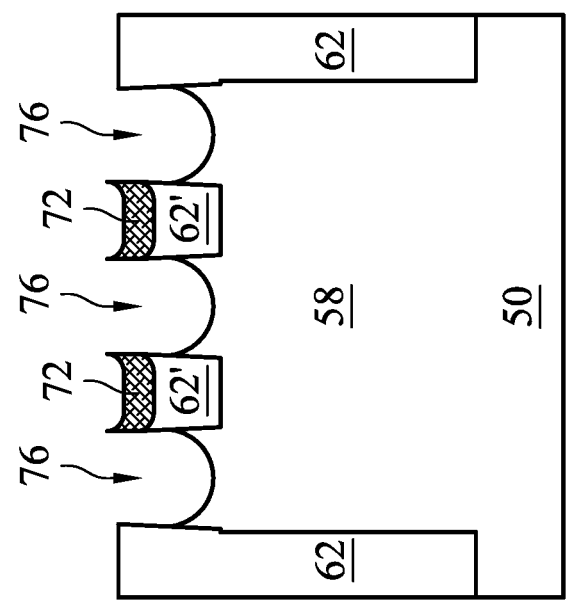

FIG. 10 illustrates the etching of the gate seal spacer material 72. The gate seal spacer material 72 may etched using an anisotropic etch process, such as a dry etch process, to remove portions of the gate seal spacer material 72 outside of the sidewalls of the gate structures. The gate seal spacer material 72 that remains on the sidewalls of the gate structures form gate seal spacers (not shown). Portions of the gate seal spacer material 72 within the recesses 76 are also removed. In some embodiments, portions of the gate seal spacer material 72 remain on the recessed isolation regions 62', as shown in FIG. 10. The remaining portions of the gate seal spacer material 72 on the recessed isolation regions 62' may have concave top surfaces, as also shown in FIG. 10. In some embodiments, the gate seal spacer material 72 is etched to have a particular shape, such as a particular sidewall angle. In some embodiments, the gate seal spacer material 72 is etched to extend a particular height above the top surface of the recessed isolation regions 62', or is etched to have a particular thickness. In some embodiments, the ratio of the thickness of the gate seal spacer material 72 to the thickness of the recessed isolation regions 62' may be between about 0.3 and about 0.8. In some cases, the thickness or the shape of the recessed isolation regions 62' or of the gate seal spacer material 72 may affect the subsequent growth of epitaxial source/drain regions formed in the recesses 76 (described in greater detail below). Accordingly, the thickness or the shape of the recessed isolation regions 62' or of the gate seal spacer material 72 may be selected to improve uniformity of the top surface of subsequently formed epitaxial source/drain regions.

Figure 11:
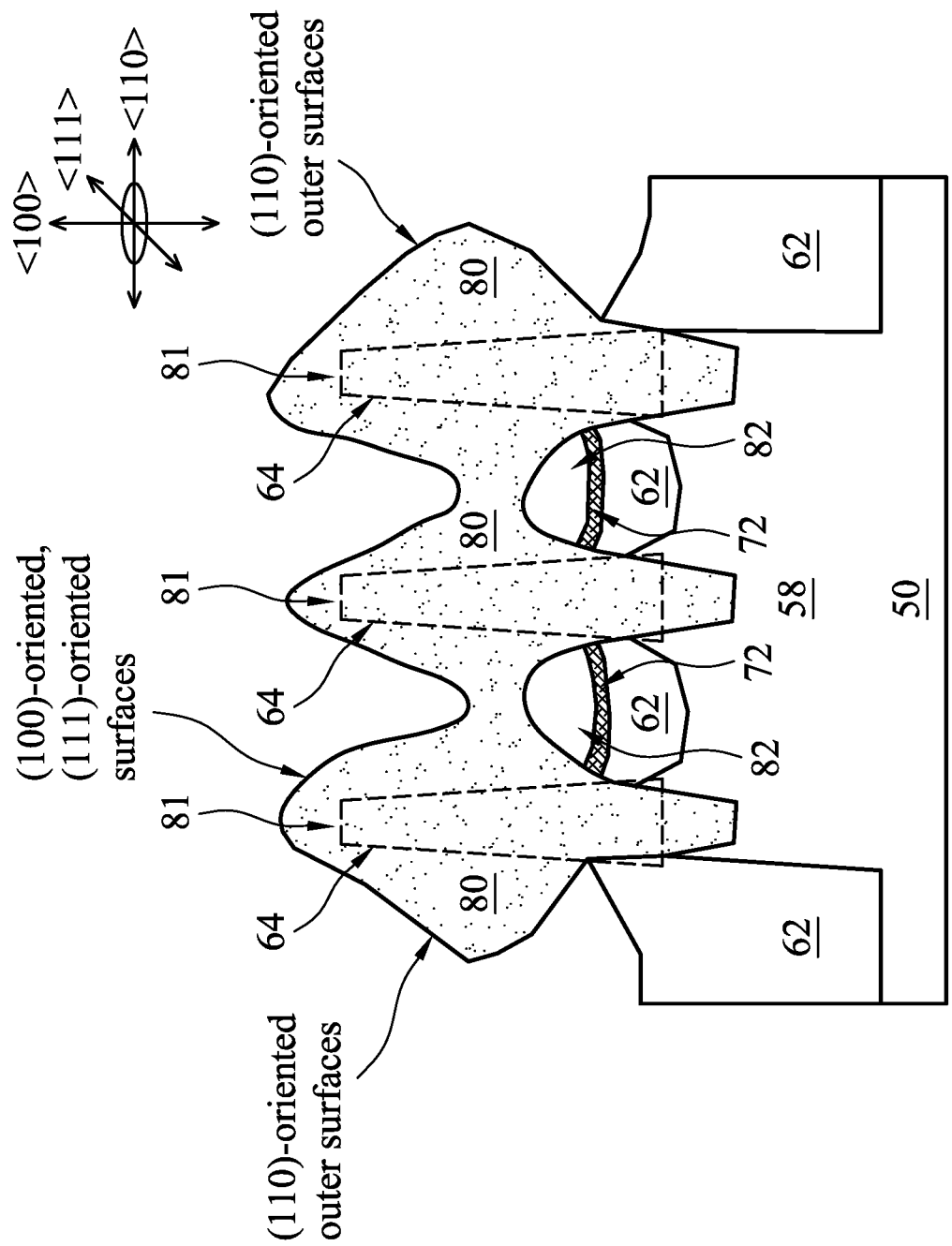
Figure 12:
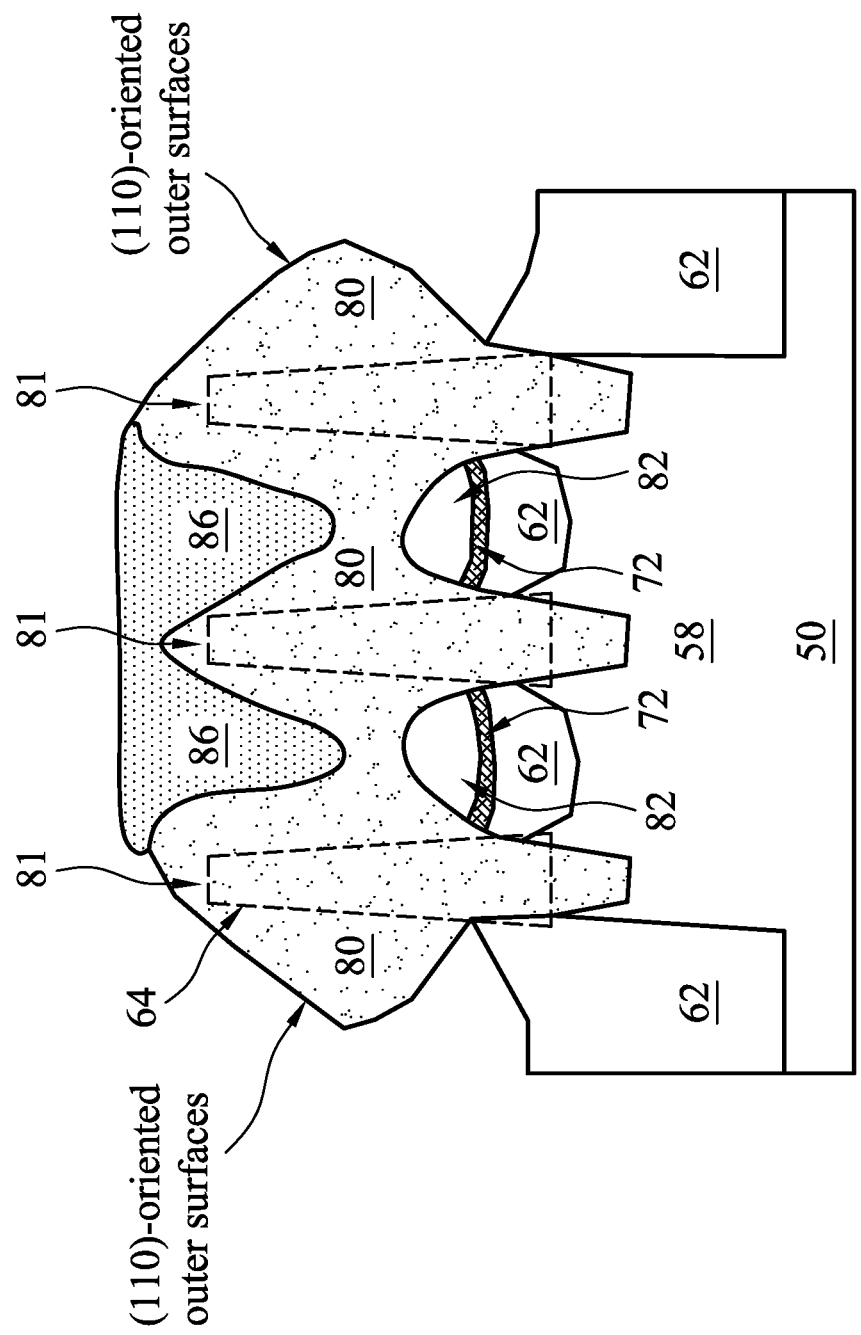
Figure 13:
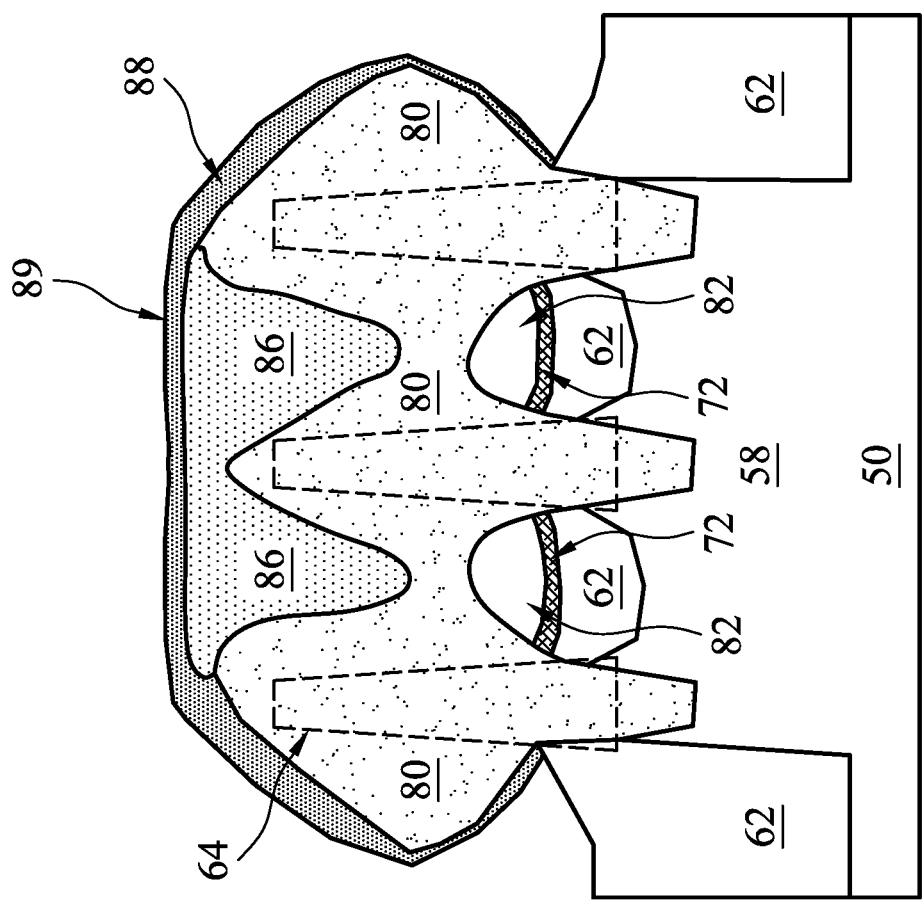

FIGS. 11 through 13 illustrate the formation of the source/drain regions. In some embodiments, formation of the source/drain regions include multiple, distinct deposition processes, and in some embodiments, formation of the source/drain regions includes a single deposition process during which deposition parameters are adjusted. As illustrated in FIG. 11, a first deposition process is performed to form first epitaxial layer 80 in the recesses 76 by epitaxially growing a material in the recesses 76. The first epitaxial layer 80 may be formed by a process such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 11, due to the blocking of the recessed isolation regions 62' and gate seal spacer material 72, the first epitaxial layer 80 first grows vertically in recesses 76, during which time the epitaxial layer does not grow horizontally. After recesses 76 are fully filled, the first epitaxial layer 80 grows both vertically and horizontally, protruding from each recess 76. In some embodiments, the outermost surfaces of the first epitaxial layer 80 may be substantially (110)-oriented. For example, the outermost surfaces may be outermost surfaces of the first epitaxial layer 80 that face away from each other, or may be surfaces on opposite ends of the first epitaxial layer 80. For example, FIG. 11 illustrates surfaces on opposite ends of the first epitaxial layer 80 as "outer surfaces." In some embodiments, the surfaces of the first epitaxial layer 80 between the outermost surfaces may include substantially (111)-oriented or (100)-oriented surfaces, or include a combination of (111)-oriented and (100)-oriented surfaces, as illustrated in FIG. 11. As illustrated in FIG. 11, the first epitaxial layer 80 of the adjacent semiconductor fins 81 may merge to form a continuous epitaxial layer 80, though in other cases one or more of the adjacent semiconductor fins 81 may not merge. Due to the blocking of the recessed isolation regions 62' and gate seal spacer material 72 and on the crown structure 58, air gaps 82 may be formed between the lower portions of the first epitaxial layer 80 and the top surface of the gate seal spacer material 72 over the crown structure 58.

In some exemplary embodiments in which the resulting FinFET is an n-type FinFET, the first epitaxial layer 80 includes silicon carbide (SiC), silicon phosphorous (SiP), phosphorous-doped silicon carbon (SiCP), or the like. In alternative exemplary embodiments in which the resulting FinFET is a p-type FinFET, the first epitaxial layer 80 comprises SiGe, and a p-type impurity such as boron or indium. In some cases, the first epitaxial layer 80 may have an impurity concentration in a range from about $1E20$ $cm^{-3}$ to about $1E21$ $cm^{-3}$. In some embodiments, the first epitaxial layer 80 may be in situ doped during growth. In other embodiments, the first epitaxial layer 80 is undoped.

As illustrated in FIG. 12, a second deposition process is performed to form second epitaxial layer 86 over the first epitaxial layer 80. The second epitaxial layer 86 may be formed by a process such as by MOCVD, MBE, LPE, VPE, SEG, the like, or a combination thereof. The second epitaxial layer 86 may include silicon carbide (SiC), silicon phosphorous (SiP), phosphorous-doped silicon carbon (SiCP), or the like. In some embodiments, the second epitaxial layer 86 is formed using SEG using multiple precursors. For example, the second epitaxial layer 86 may be formed using precursors including dichloro-silane (DCS) as a growth precursor, and $SiH_4$ and/or HCl as etching precursors. By adjusting the precursor ratios, the formation temperature, and the formation pressure, the second epitaxial layer 86 may be selectively formed over and between the adjacent semiconductor fins 81A of the first epitaxial layer 80 and not formed on the outermost surfaces of the first epitaxial layer 80. For example, in some embodiments, the first epitaxial layer 80 may have substantially (110)-oriented outermost surfaces and substantially (111)-oriented or (100)-oriented surfaces between the outermost surfaces. An SEG process may preferentially etch (110)-oriented crystalline orientations over (100)-oriented or (111)-oriented crystalline orientations, resulting in reduced growth of the second epitaxial layer 86 on the outermost (110)-oriented surfaces of the first epitaxial layer 80. In this manner, the growth rate of the second epitaxial layer 86 on outermost surfaces of the first epitaxial layer 80 can be less than the growth rate of the second epitaxial layer 86 on other surfaces of the first epitaxial layer 80. In some embodiments, the temperature for forming the second epitaxial layer 86 may be in a range from about 600° C. to about 750° C., and the pressure may be in a range from about 10 torr to about 600 torr.

In some cases, selectively growing the second epitaxial layer 86 over and between the adjacent semiconductor fins 81 can facilitate merging between the adjacent semiconductor fins 81 and also can provide a substantially flat or uniform top surface of the source/drain regions. In some cases, the formation of a substantially flat second epitaxial layer 86 as described herein may allow for a better quality electrical contact between the silicide layer 92 and the second epitaxial layer 86 (described below). The formation of a substantially flat second epitaxial layer 86 may also allow the FinFET to be less sensitive to process variations or process defects and also may improve process reproducibility. In some cases, a top surface of the second epitaxial layer 86 may have height variations of less than about 5 nm. In some cases, a top surface of the second epitaxial layer 86 may be between about 30 nm and about 60 nm above the gate seal spacer material 72, such as about 40 nm above the gate seal spacer material 72. In some cases, a top surface of the second epitaxial layer 86 may be between about 3 nm and about 20 nm higher than a top surface of a semiconductor fin 81.

In some embodiments, some or all of the second epitaxial layer 86 may have higher doping than the first epitaxial layer 80. For example, portions of the second epitaxial layer 86 may have an impurity concentration in a range from about $1E21$ $cm^{-3}$ to about $5E21$ $cm^{-3}$. In some embodiments, the second epitaxial layer 86 may be in situ doped during growth. In some embodiments, the second epitaxial layer 86 includes SiP that has relatively high phosphorus doping. In some cases, by forming the second epitaxial layer with relatively high doping, the contact resistance of the subsequently formed silicide can be reduced (discussed in greater detail below). In some embodiments, the portions of the second epitaxial layer 86 with the highest doping are located between the adjacent semiconductor fins 81.

In some embodiments, the first epitaxial layer 80 and the second epitaxial layer 86 may be formed in a single, continuous epitaxial process. In other embodiments, these epitaxial layers may be formed in separate processes. In an embodiment using a single, continuous process, the processing parameters of the epitaxial process (e.g. process gas flow, temperature, pressure, etc.) can be varied to form these structures with the varying material compositions. For example, during the epitaxy, the flow rate of the precursors may be at a first level during the formation of the first epitaxial layer 80 and may be adjusted to a second level when transitioning to the formation of the second epitaxial layer 86.

As illustrated in FIG. 13, a capping layer 88 may be formed over the second epitaxial layer 86 and the first epitaxial layer 80. The capping layer 88 may include a material such as SiP, SiGe, SiGeP, or the like. The capping layer 88 may be formed by a process such as by MOCVD, MBE, LPE, VPE, SEG, the like, or a combination thereof. In some embodiments, the capping layer 88 is formed using SEG using multiple precursors. For example, the capping layer 88 may be formed using precursors including germane (GeH4), and/or DCS as growth precursors, and HCl as an etching precursor. In some embodiments, a top surface of the second epitaxial layer 86 is substantially flat, and a top surface of the capping layer 88 formed over the second epitaxial layer 88 is also substantially flat.

Figure 14:
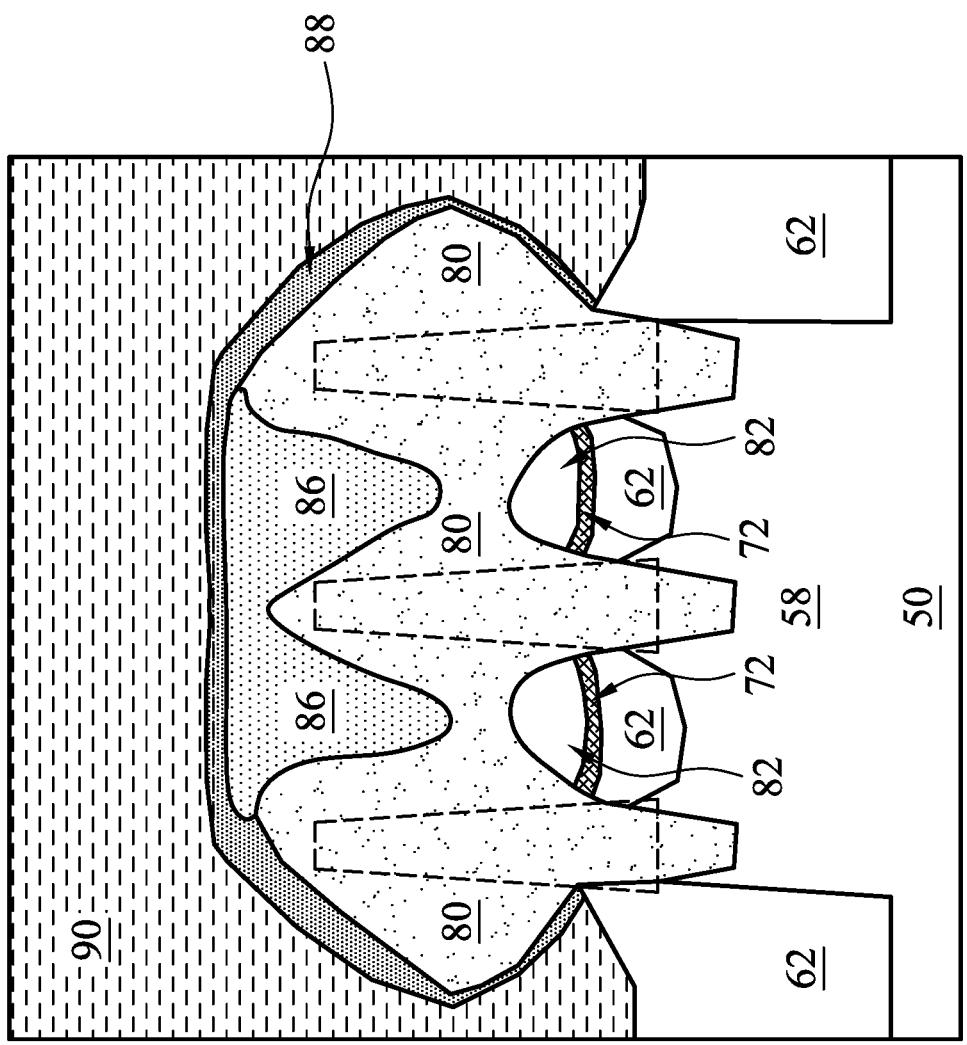

In FIG. 14, an interlayer dielectric (ILD) 90 is deposited over the structure illustrated in FIG. 13. The ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 15:
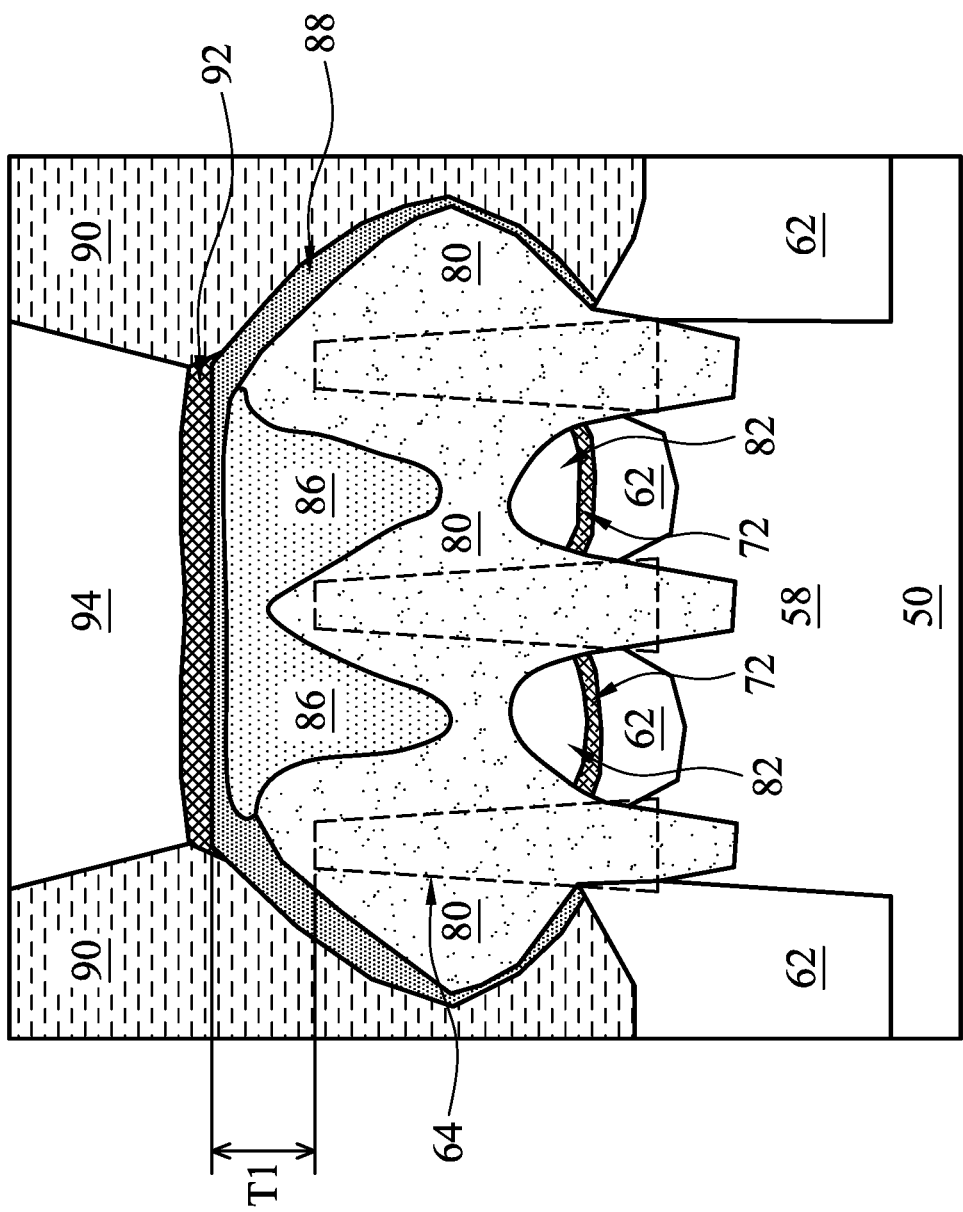

In FIG. 15, a contact 94 is formed through ILD 90. The opening for contact 94 is formed through the ILD 90. The opening may be formed using acceptable photolithography and etching techniques. In some embodiments, at least a portion of the capping layer 88 and/or the second epitaxial layer 86 is removed during the formation of the opening.

A silicide layer 92 may then be formed over the second epitaxial layer 86. In some embodiments, the silicide layer 92 is formed by depositing a conductive material and then performing an anneal process. The conductive material may be a material such as Ti, Co, or another material. For example, a silicide layer 92 including $TiSi_2$ may be formed from Ti conductive material, or a silicide layer 92 including $CoSi_2$ may be formed from Co conductive material. In some cases, some capping layer 88 material diffuses into the silicide layer 92. For example, in the case that the capping layer 88 includes SiGe, the silicide layer 92 may include Ge impurities diffused from the capping layer 88. In some cases, the presence of Ge in the capping layer 88 may increase the rate of silicidation of the silicide layer 92. In some cases, diffusing Ge into the silicide layer 92 may allow de-pinning of the Fermi level of the silicide layer 92 at the source/drain contact between the silicide layer 92 and the second epitaxial layer 86, which can reduce the Schottky barrier height of the source/drain contact and also reduce contact resistance of the source/drain contact.

In some embodiments, forming a second epitaxial layer 86 as described herein may allow the silicide layer 92 to be formed at a greater height above the semiconductor fins 64. By forming the silicide layer 92 farther from the semiconductor fins 64, the chance of the silicide layer 92 being shorted to the gate 68 is reduced. In this manner, the FinFET, and in particular the semiconductor fins 64, may be less sensitive to process variations or process defects. In some embodiments, the distance T1 between the top of the semiconductor fins 64 and the silicide layer 92 may be between about 5 nm and about 20 nm, such as about 10 nm.

In some embodiments, the use of a highly-doped second epitaxial layer 86 adjacent the silicide layer 92 can reduce resistance of the silicide-epitaxy contact. In a metal-semiconductor junction such as the source/drain contact between the silicide layer 92 and the second epitaxial layer 86, the electrical resistance is inversely proportional to the doping concentration of the semiconductor at or near the junction. Thus, a higher doping concentration of the second epitaxial layer 86 can reduce the resistance of the source/drain contacts of the FinFET. In this manner, the use of a highly-doped second epitaxial layer 86 as described herein can reduce source/drain contact resistance and also increase the $I_{ON}$ current of the FinFET, which can increase efficiency of the FinFET.

In some cases, a liner, such as a diffusion barrier layer, an adhesion layer, or the like, and a conductive material are formed in the contact opening. The liner may include titanium, titanium nitride, tantalum, tantalum nitride, or the like. The contact 94 is then formed within the opening over the silicide layer 92. The contact 94 may include a conductive material such as copper, a copper alloy, silver, gold, tungsten, aluminum, nickel, or the like. A planarization process, such as a CMP, may be performed to remove excess material from a surface of the ILD 90.

Although not explicitly shown, a person having ordinary skill in the art will readily understand that further processing steps may be performed on the structure in FIG. 15. For example, various inter-metal dielectrics (IMD) and their corresponding metallizations may be formed over ILD 90. Further, contacts to the gate electrode 68 may be formed through overlying dielectric layers.

Further, in some embodiments, a gate-last process (sometimes referred to as replacement gate process) may be used. In those embodiments, the gate 68 and the gate dielectric 66 may be considered dummy structures and will be removed and replaced with an active gate and active gate dielectric during subsequent processing.

As described herein, the use of a highly-doped epitaxial layer formed substantially between adjacent epitaxial fins may increase the likelihood of forming a merged source/drain structure. Moreover, the highly-doped epitaxial layer may be formed such that the top surface of the source/drain structure is substantially flat or uniform. The highly-doped epitaxial layer may also allow the silicide to be formed farther from the fins, and may also reduce resistance of the source/drain contacts.

In accordance with an embodiment, a method includes forming a first fin and a second fin over a substrate, the second fin being adjacent the first fin, depositing an isolation material surrounding the first fin and the second fin, a first portion of the isolation material being between the first fin and the second fin, upper portions of the first fin and the second fin extending above a top surface of the isolation material, forming a gate structure along sidewalls and over upper surfaces of the first fin and the second fin, recessing the first fin and the second fin outside of the gate structure to form a first recess in the first fin and a second recess in the second fin, epitaxially growing a first source/drain material protruding from the first recess of the first fin and protruding from the second recess of the second fin, and epitaxially growing a second source/drain material on the first source/drain material, wherein the second source/drain material grows at a slower rate on outermost surfaces of opposite ends of the first source/drain material than on surfaces of the first source/drain material that are between the opposite ends of the first source/drain material, and wherein the second source/drain material has a higher doping concentration than the first source/drain material. In an embodiment, the method further includes recessing the first portion of the isolation material. In an embodiment, a portion of the second source/drain material having the highest dopant concentration of the second source/drain material is located laterally between the first source/drain material protruding from the first recess of the first fin and the first source/drain material protruding from the second recess of the second fin. In an embodiment, epitaxially growing the second source/drain material includes epitaxially growing SiP. In an embodiment, the doping concentration of the second source/drain material includes a concentration of phosphorous. In an embodiment, the method further includes depositing a gate seal spacer on sidewalls of the gate structure, a first portion of the gate seal spacer being on the first portion of the isolation material between the first fin and the second fin, the first portion of the gate seal spacer being interposed between the first portion of the isolation material and the first source/drain material. In an embodiment, the method further includes forming a capping layer over the second source/drain material. In an embodiment, the capping layer includes germanium. In an embodiment, the method further includes forming a silicide over the second source/drain material. In an embodiment, the first source/drain material protruding from the first recess of the first fin physically contacts the first source/drain material protruding from the second recess of the second fin.

In accordance with an embodiment, a method includes forming fins on a substrate, forming an isolation region surrounding the fins, a first portion of the isolation region being between adjacent fins, forming a gate structure over the fins, recessing portions of the fins adjacent the gate structure, and forming source/drain regions on opposing sides of the gate structure. At least one of the source/drain regions extends over the first portion of the isolation region. Forming the source/drain regions includes forming first epitaxial layers on the recessed portions of the fins using a first epitaxial process and forming a second epitaxial layer extending over the first epitaxial layers using a second epitaxial process different from the first epitaxial process, wherein the second epitaxial process promotes growth between adjacent first epitaxial layers and suppresses growth on the outermost epitaxial layers. In an embodiment, adjacent first epitaxial layers are merged. In an embodiment, the method further includes forming a capping layer over the second epitaxial layer. In an embodiment, the capping layer includes Ge. In an embodiment, forming the second epitaxial process includes doping the second epitaxial layer with a higher dopant concentration than the first epitaxial layers. In an embodiment, a top surface of the second epitaxial layer is flat.

In accordance with an embodiment, a structure includes a first fin over a substrate and a second fin over the substrate, the second fin being adjacent the first fin. The structure also includes an isolation region surrounding the first fin and the second fin, a first portion of the isolation region being between the first fin and the second fin. The structure also includes a gate structure along sidewalls and over upper surfaces of the first fin and the second fin, the gate structure defining channel regions in the first fin and the second fin.

The structure also includes a source/drain region on the first fin and the second fin adjacent the gate structure, wherein the source/drain region includes a second epitaxial region over a first epitaxial region, and wherein the second epitaxial region has a higher doping concentration than the first epitaxial region. The structure also includes a silicide over the source/drain region. In an embodiment, a vertical distance between a top surface of the first fin and a bottom surface of the silicide is between about 5 nm to about 20 nm. In an embodiment, the source/drain region includes SiP. In an embodiment, the silicide includes $TiSi_2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin over a substrate;
   depositing an isolation material surrounding the first fin and the second fin;
   forming a gate structure on the first fin and the second fin;
   recessing the first fin and the second fin to form a first recess in the first fin and a second recess in the second fin;
   epitaxially growing a first source/drain region protruding from the first recess of the first fin and a second source/drain region protruding from the second recess of the second fin, wherein the first source/drain region and the second source/drain region comprise a first epitaxial material, wherein the first epitaxial material extends continuously from the first source/drain region to the second source/drain region; and
   epitaxially growing a second epitaxial material on the first source/drain region and the second source/drain region, wherein the second epitaxial material grows at a first rate on an exposed first top surface of the first source/drain region that faces away from the second source/drain region and faces away from the substrate, wherein the second epitaxial material grows at the first rate on an exposed first top surface of the second source/drain region that faces away from the first source/drain region and faces away from the substrate, wherein the second epitaxial material grows at a second rate on an exposed second top surface of the first source/drain region that faces toward the second source/drain region and faces away from the substrate, wherein the second epitaxial material grows at the second rate on an exposed second surface of the second source/drain region that faces toward the first source/drain region and faces away from the substrate, wherein the second rate is greater than the first rate, wherein the second epitaxial material is different than the first epitaxial material.

2. The method of claim 1 further comprising depositing a capping layer that covers the second top surface of the first source/drain region, the second top surface of the second source/drain region, and a top surface of the second epitaxial material.

3. The method of claim 2 further comprising forming a silicide on the capping layer.

4. The method of claim 1, wherein the capping layer comprises germanium.

5. The method of claim 1, wherein the first top surface of the first source/drain region extends over a top surface of the first fin, wherein the first top surface of the second source/drain region extends over a top surface of the second fin.

6. The method of claim 1, wherein a top surface of the second epitaxial material is flat.

7. The method of claim 1, wherein the second epitaxial material grows at the first rate on a first bottom surface of the first source/drain region that faces away from the second source/drain region and on a first bottom surface of the second source/drain region that faces away from the first source/drain region.

8. The method of claim 1, wherein the second epitaxial material grows at the first rate on (110) surfaces.

9. A method comprising:
   forming a first fin, a second fin, and a third fin protruding from a semiconductor substrate, wherein the third fin is between the first fin and the second fin;
   forming a gate structure extending over the first fin, the second fin, and the third fin;
   forming a first epitaxial layer using a first epitaxial process, wherein the first epitaxial layer continuously extends on the first fin, the second fin, and the third fin, wherein a first region of the first epitaxial layer protruding from the first fin has surfaces mostly comprising a first crystalline orientation, wherein a second region of the first epitaxial layer protruding from the second fin has surfaces mostly comprising the first crystalline orientation, wherein a third region of the first epitaxial layer continuously extending from the first region to the second region has surfaces mostly comprising crystalline orientations other than the first crystalline orientation;
   forming a second epitaxial layer on the third region of the first epitaxial layer using a second epitaxial process, wherein the second epitaxial process suppresses epitaxial growth on surfaces of the first epitaxial layer that have the first crystalline orientation, wherein the first region and the second region are free of the second epitaxial layer.

10. The method of claim 9, wherein the first crystalline orientation is (110).

11. The method of claim 9, wherein the second region has surfaces mostly comprising (111) crystalline orientations.

12. The method of claim 9, wherein the second region has surfaces mostly comprising (100) crystalline orientations.

13. The method of claim 9, wherein the second epitaxial process is a Selective Epitaxial Growth (SEG) process.

14. The method of claim 13, wherein the second epitaxial process uses $SiH_4$ or HCl as etching precursors.

15. The method of claim 9, wherein a thickness of the second epitaxial layer adjacent the third fin is greater than a thickness of the second epitaxial layer over the third fin.

16. The method of claim 9, wherein the first region of the first epitaxial layer and the second region of the first epitaxial layer laterally protrude from the third region of the first epitaxial layer farther than the second epitaxial layer.

17. A device comprising:
   a first fin over a substrate;
   a second fin over the substrate;
   a gate structure along sidewalls and over upper surfaces of the first fin and the second fin;

a source/drain region on the first fin and the second fin, wherein the source/drain region comprises:
    a first epitaxial region across the first fin and the second fin, wherein a first region of the first epitaxial region that is between the first fin and the second fin has a smaller thickness than a second region of the first epitaxial region that is over the first fin; and
    a second epitaxial region on the first region of the first epitaxial region, wherein the second region of the first epitaxial region is free of the second epitaxial region, wherein a top surface of the second epitaxial region is farther from the substrate than a top surface of the first epitaxial region, wherein the top surface of the second epitaxial region has height variation of less than 5 nm;
a silicide region over the source/drain region, wherein surfaces of the first epitaxial region of the source/drain region are free of the silicide region; and
a contact on the silicide region.

18. The device of claim 17, wherein the second epitaxial region has a greater doping concentration than the first epitaxial region.

19. The device of claim 17 further comprising a capping layer that extends on the first epitaxial region and on the second epitaxial region, wherein the silicide region is on the capping layer.

20. The device of claim 17, wherein the second region of the first epitaxial region comprises (110) crystalline surfaces, wherein the first region of the first epitaxial region comprises (111) and (100) crystalline surfaces.

* * * * *